(12) United States Patent
Huang et al.

(10) Patent No.: US 9,034,102 B2
(45) Date of Patent: May 19, 2015

(54) METHOD OF FABRICATING HYBRID ORIENTATION SUBSTRATE AND STRUCTURE OF THE SAME

(75) Inventors: Yao-Tsung Huang, Kaohsiung County (TW); Chien-Ting Lin, Hsinchu (TW); Che-Hua Hsu, Hsinchu County (TW); Guang-Hwa Ma, Hsinchu (TW)

(73) Assignee: UNITED MICROELECTRONICS CORP., Science-Based Industrial Park, Hsinchu (TW)

(*) Notice: Subject to any disclaimer, the term of this patent is extended or adjusted under 35 U.S.C. 154(b) by 2210 days.

(21) Appl. No.: 11/693,455

(22) Filed: Mar. 29, 2007

(65) Prior Publication Data

US 2008/0237809 A1  Oct. 2, 2008

(51) Int. Cl.

| | |
|---|---|
| *C30B 1/02* | (2006.01) |
| *H01L 29/04* | (2006.01) |
| *H01L 21/02* | (2006.01) |
| *C30B 29/06* | (2006.01) |
| *C30B 33/00* | (2006.01) |
| *H01L 21/265* | (2006.01) |
| *H01L 21/8238* | (2006.01) |
| *H01L 29/78* | (2006.01) |

(52) U.S. Cl.
CPC ........ *H01L 29/045* (2013.01); *H01L 21/02532* (2013.01); *H01L 21/02609* (2013.01); *C30B 1/023* (2013.01); *C30B 29/06* (2013.01); *C30B 33/00* (2013.01); *H01L 21/26506* (2013.01); *H01L 21/823807* (2013.01); *H01L 21/823878* (2013.01); *H01L 29/7847* (2013.01)

(58) Field of Classification Search
CPC ............ H01L 29/045; H01L 21/02532; H01L 21/02609; H01L 21/26506; H01L 21/823807; H01L 21/823878; H01L 21/7847; C30B 1/023; C30B 29/06; C30B 33/00
USPC .................................................. 117/4, 5, 8, 9
See application file for complete search history.

(56) References Cited

U.S. PATENT DOCUMENTS

| | | | | |
|---|---|---|---|---|
| 6,621,131 | B2* | 9/2003 | Murthy et al. | 257/408 |
| 7,060,585 | B1* | 6/2006 | Cohen et al. | 438/355 |
| 2005/0116290 | A1 | 6/2005 | de Souza | |
| 2005/0205859 | A1* | 9/2005 | Currie et al. | 257/19 |
| 2006/0154429 | A1 | 7/2006 | de Souza | |
| 2006/0276011 | A1* | 12/2006 | Fogel et al. | 438/486 |
| 2006/0284250 | A1* | 12/2006 | Hsu et al. | 257/347 |
| 2007/0215984 | A1* | 9/2007 | Shaheen et al. | 257/618 |

* cited by examiner

*Primary Examiner* — Matthew Song
(74) *Attorney, Agent, or Firm* — Winston Hsu; Scott Margo

(57) ABSTRACT

A method of fabricating a hybrid orientation substrate is described. A silicon substrate with a first orientation having a silicon layer with a second orientation directly thereon is provided, and then a stress layer is formed on the silicon layer. A trench is formed between a first portion and a second portion of the silicon layer through the stress layer and into the substrate. The first portion of the silicon layer is amorphized. A SPE process is performed to recrystallize the amorphized first portion of the silicon layer to be a recrystallized layer with the first orientation. An annealing process is performed at a temperature lower than 1200° C. to convert a surface layer of the second portion of the silicon layer to a strained layer. The trench is filled with an insulating material after the SPE process or the annealing process, and the stress layer is removed.

15 Claims, 3 Drawing Sheets

US 9,034,102 B2

METHOD OF FABRICATING HYBRID ORIENTATION SUBSTRATE AND STRUCTURE OF THE SAME

BACKGROUND OF THE INVENTION

1. Field of Invention

This invention relates to a semiconductor structure and fabrication of the same. More particularly, this invention relates to a method of fabricating a hybrid orientation substrate and a structure of a hybrid orientation substrate that can be fabricated with the same method.

2. Description of Related Art

As the requirements on the integration degree and speeds of integrated circuits unceasingly get higher, the dimensions of semiconductor devices are reduced rapidly, and certain ways other than the dimension reduction to improve the device speed have been studied. For example, the strained silicon technology and the hybrid crystal orientation technology have been frequently applied in many processes.

The strained silicon technology features causing a compressive or tensile strain in a silicon layer to enhance the mobility of holes or electrons and thereby improve the device speed. A channel region of strained silicon may be formed by forming the hard mask layer for defining the trench of device isolation as a compressive or tensile stress layer. The strain in the channel can be retained after the hard mask layer is removed.

On the other hand, the hybrid crystal orientation technology features areas of two different crystal orientations on a single silicon wafer. The two orientations are usually <100> and <110>, because the electron mobility is higher in <100> silicon and the hole mobility in <110> silicon is 2-4 times higher than that in <100> silicon. One method to form a hybrid orientation substrate with a trench isolation structure thereon is based on the amorphization/templated recrystallization (ATR) approach, which is applied to a direct-silicon-bonded (DSB) wafer that includes a <100> silicon substrate and a <110> silicon layer directly thereon. Selected portions of the <110> silicon layer are first amorphized with ion implantation after a trench isolation structure is formed, and then a solid-phase epitaxy (SPE) process is performed to convert the amorphized silicon to <100> silicon based on the <100> silicon of the underlying substrate.

However, a portion of the amorphized silicon at the trench corners cannot be converted to <100> silicon but forms trench-edge defects. There are also defects formed near the interface between the substrate and the recrystallized layer. Thus, the devices formed on the recrystallized layer including NMOS transistors do not have good reliability.

To prevent the trench-edge defects, U.S. Patent Application Publication No. 2005/0116290 provides an improved method that performs the SPE process after the trench of the trench isolation is formed but before the same is filled with an insulating material, so as to achieve a complete recrystallization of the amorphized silicon.

On the other hand, to eliminate the defects formed near the interface between the silicon substrate and the recrystallized silicon, U.S. Patent Application Publication No. 2006/0154429 provides an improved method that adds high-temperature annealing at 1200-1400° C. particularly after the above SPE process to rearrange the silicon atoms.

SUMMARY OF THE INVENTION

This invention provides a method of fabricating a hybrid orientation substrate that combines the hybrid orientation technique utilizing the ATR mechanism with the strain silicon technique.

This invention also provides a structure of a hybrid orientation substrate that can be fabricated with the above method of this invention.

The method of fabricating a hybrid orientation substrate of the present invention is described as follows. A silicon substrate with a first orientation that has a silicon layer with a second orientation directly thereon is provided, and a stress layer is formed on the silicon layer. A trench is formed between a first portion and a second portion of the silicon layer through the stress layer and into the substrate. The first portion of the silicon layer is amorphized. A solid-phase epitaxy process is done to recrystallize the first portion of the silicon layer to be a recrystallized layer with the first orientation, and then an annealing process is performed at a temperature lower than 1200° C. to convert a surface layer of the second portion of the silicon layer to a strained layer. The trench is filled with an insulating material after the SPE process or the annealing process. The stress layer is removed after the above steps.

When the first orientation is <100> and the second orientation is <110>, a PMOS transistor is to be formed on the strained layer on the second portion of the silicon layer of <110> orientation for higher hole mobility, a NMOS transistor is to be formed on the recrystallized layer of <100> orientation for higher electron mobility, and the stress layer is a compressive stress layer to make the strained layer a compressive-strained one that can speed up the PMOS transistor.

When the first orientation is <110> and the second orientation <100>, a NMOS transistor is to be formed on the strained layer on the second portion of the silicon layer of <100> orientation for higher electron mobility, a PMOS transistor is to be formed on the recrystallized layer of <110> orientation for higher hole mobility, and the stress layer is a tensile stress layer to make the strained layer a tensile-strained one that can speed up the NMOS transistor.

The structure of a hybrid orientation substrate of this invention includes a silicon substrate with a first orientation that has a trench therein, a first silicon layer that is directly on the substrate and is a recrystallized silicon layer with the first orientation, a second silicon layer with a second orientation directly on the substrate, a strained silicon layer with the second orientation directly on the second silicon layer, and an isolation structure that separates the first and the second silicon layers and fills the trench.

In order to make the aforementioned and other objects, features and advantages of the present invention comprehensible, a preferred embodiment accompanied with figures is described in detail below.

DESCRIPTION OF EMBODIMENTS

First Embodiment

FIGS. 1A-1F illustrate a process flow of fabricating a hybrid orientation substrate according to the first embodiment of this invention.

Figure 1A:
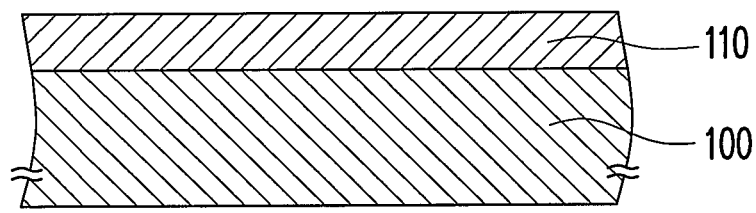
FIGS. 1A-1F illustrate a process flow of fabricating a hybrid orientation substrate according to a first or second embodiment of this invention, wherein FIG. 1F also shows a structure of a hybrid orientation substrate according to an embodiment of the same.

Referring to FIG. 1A, a silicon substrate 100 of <100> orientation, which has a silicon layer 110 of <110> orientation directly thereon, is provided. Such a direct-silicon-bonded (DSB) substrate may be formed by joining a silicon-on-insulator (SOI) wafer of <110> orientation with oxide thereon to a silicon wafer of <100> orientation also with oxide thereon through hydrophilic bonding of the oxide, removing the oxide between the two wafers as well as the insulator and bulk silicon of the SOI wafer, and then planarizing the resulting <110> crystal plane of silicon.

Figure 1B:
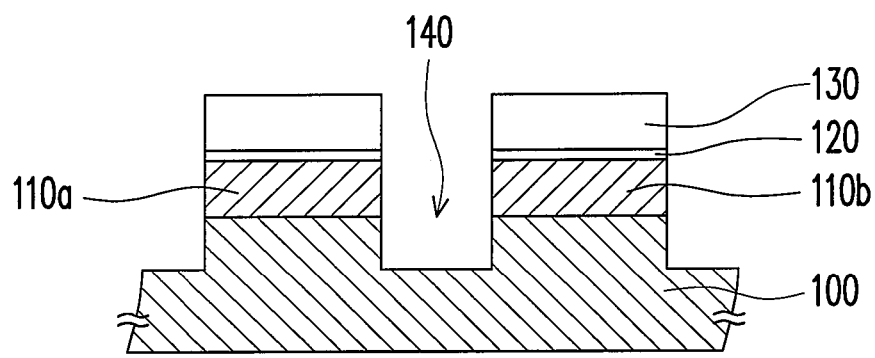

Referring to FIGS. 1A and 1B, a stress layer 130 that may serve as a hard mask layer is formed on the silicon layer 110, and then a trench 140 is formed through a first portion 110b and a second portion 110a of the silicon layer 110 through the stress layer 130 and into the silicon substrate 100. In addition, a pad oxide layer 120 is preferably formed on the silicon layer 110 to serve as a buffer layer before the stress layer 130 is formed. The material of the stress layer 130 may be silicon nitride formed with CVD.

In this embodiment, the stress layer 130 is a compressive stress layer, because a compressive stress causes a compressive strain raising the hole mobility and a PMOS transistor is to be formed on the second portion 110a of the <110> silicon layer 110 that is not to be implanted for amorphization so that the stress in the stress layer 130 over it can be retained to cause strained silicon.

Figure 1C:
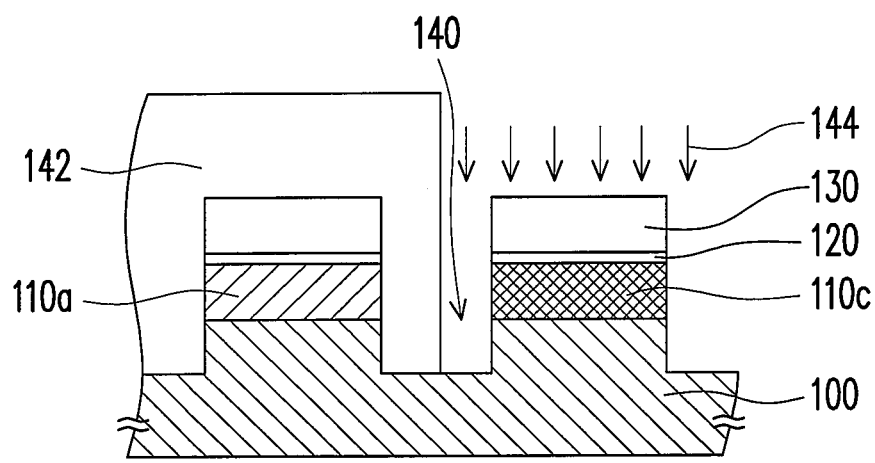

Referring to FIG. 1C, after a patterned photoresist layer 142 is formed masking the second portion 110a of the silicon layer 110, the first portion 110b is amorphized to be an amorphous silicon (a-Si) layer 110c by ion implantation 144 through the stress layer 130 and the pad oxide layer 120. The amorphizing ion may be selected from the group consisting of Si, Ge, Ar, C, O, N, H, He, Kr, Xe, P, B and As ions. It is noted that the compressive stress in the stress layer 130 over the a-Si layer 110c is erased by the ion implantation 144.

Figure 1D:
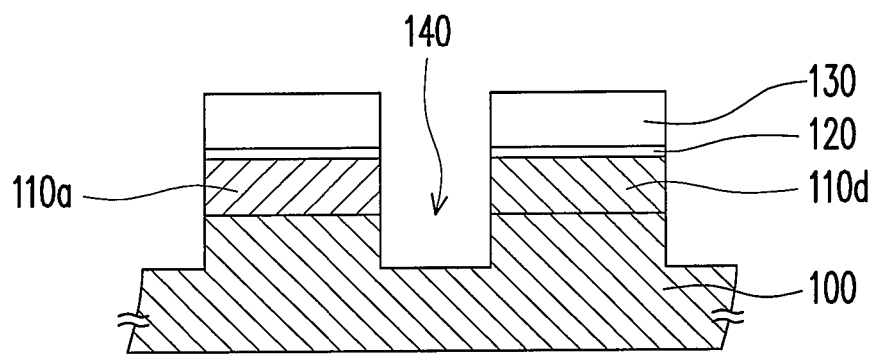

Referring to FIG. 1D, after the photoresist layer 142 is removed, a SPE process is performed to recrystallize the a-Si layer 110c to be a recrystallized layer 110d of <100> orientation. The SPE process is preferably performed at a temperature between 500° C. and 700° C. for a certain time period depending on the thickness of the a-Si layer 110c.

Figure 1E:
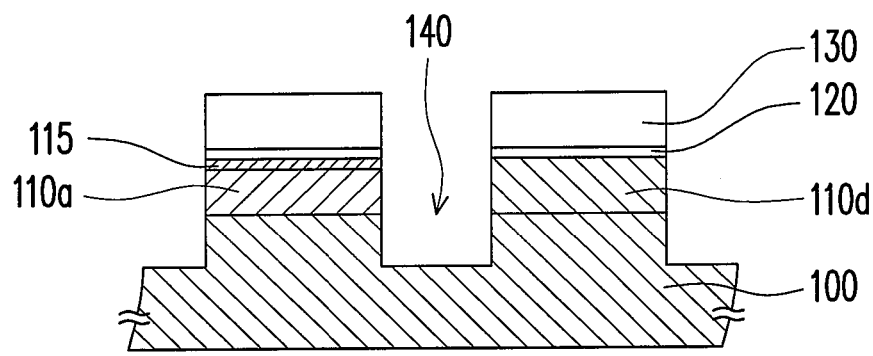

Referring to FIG. 1E, an annealing process is done at a temperature lower than 1200° C. to convert a surface layer of the second portion 110a of the silicon layer 110 of <110> orientation to a strained layer 115 of <110> orientation. Since the compressive stress in the stress layer 130 over the recrystallized layer 110d has been erased by the ion implantation 144 for forming the a-Si layer 110c, no strained silicon is formed in the recrystallized layer 110d. The annealing process is preferably conducted at a temperature between 900° C. and 1150° C. for 10-240 minutes. Because the stress layer 130 is a compressive stress layer, the strained layer 115 is a compressive-strained silicon layer of <110> orientation that can much increase the speed of the PMOS transistor to be formed thereon.

Figure 1F:
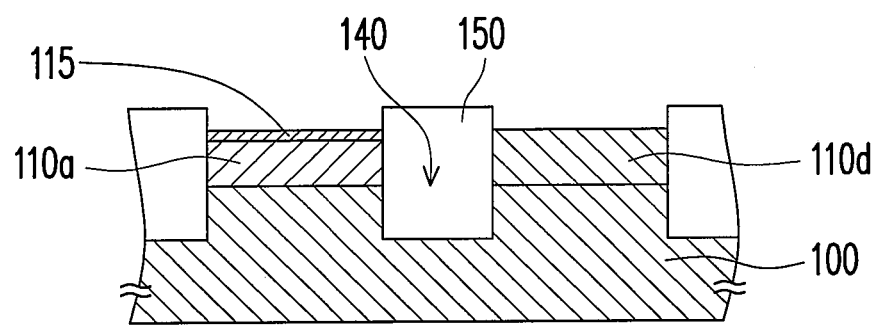

Referring to FIGS. 1E and 1F, the trench 140 is filled with an insulating material to form a shallow trench isolation (STI) structure 150, and then the stress layer 130 and the pad oxide layer 120 are removed possibly through wet etching.

Second Embodiment

The process flow of fabricating a hybrid orientation substrate according to the second embodiment of the invention is also illustrated in FIGS. 1A-1F.

The fabricating process according to the second embodiment is similar to that according to the first one except the orientation of each silicon part in the structure in each of FIGS. 1A-1F. Specifically, the orientation of the substrate 100 and the recrystallized layer 110d is <110>, and that of the silicon layer 110, the portions 110a and 110b of the silicon layer 110 and the strained layer 115 is <100>. The portion 110a of the silicon layer 110 and the strained layer 115 thereon is for forming a NMOS transistor. The recrystallized layer 110d is for forming a PMOS transistor. The stress layer 130 is a tensile stress layer to make the strained layer 115 a tensile-strained one that can increase the speed of the NMOS transistor to be formed thereon.

Third Embodiment

Figure 2A:
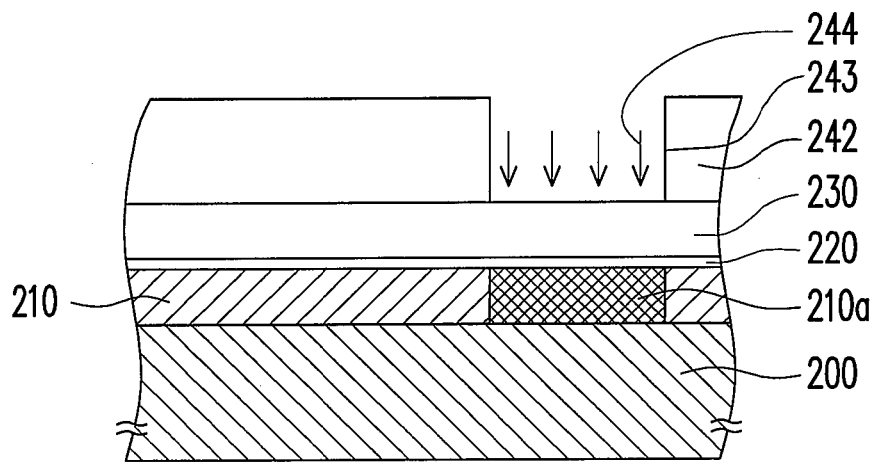
FIGS. 2A-2C illustrate a process flow of fabricating a hybrid orientation substrate according to a third or fourth embodiment of this invention.
Figure 2B:
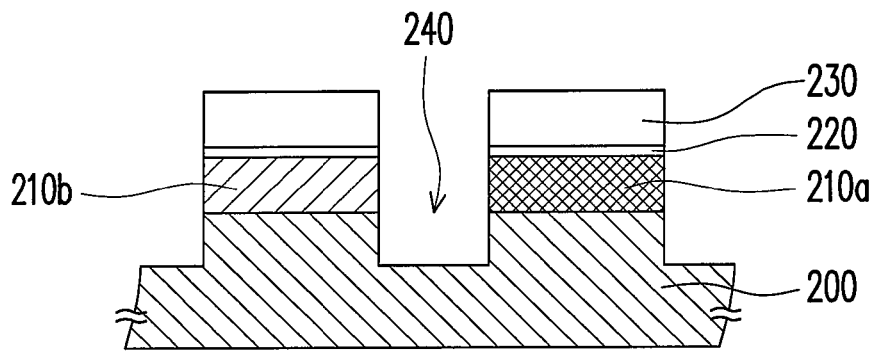
Figure 2C:
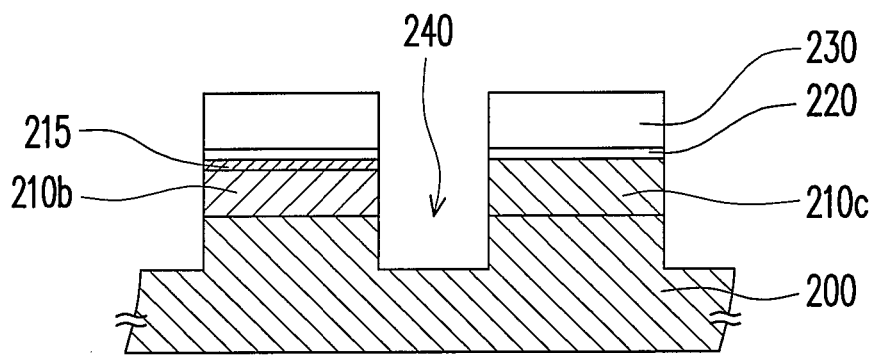

FIGS. 2A-C illustrate a process flow of fabricating a hybrid orientation substrate according to a third or fourth embodiment of this invention.

Referring to FIG. 2A, a silicon substrate 200 of <100> orientation with a silicon layer 210 of <110> orientation directly thereon is provided, and then a stress layer 230 is formed over the silicon layer 210 possibly after a pad oxide layer 220 as a buffer layer is formed on the silicon layer 210. The method of forming this DSB substrate (200+210) as well as the material and forming method of the stress layer 230 can be the same as those mentioned in the first embodiment.

In this embodiment, the stress layer 230 is a compressive stress layer, because a compressive stress causes compressive-strained silicon that increases hole mobility and a PMOS transistor is to be formed on a portion of the <110> silicon layer 210 that is not to be implanted for amorphization so that the stress in the stress 230 thereover can be retained the strain caused by the stress layer 230 to cause strained silicon.

A patterned photoresist layer 242, which has an opening 243 therein exposing a first portion 210a of the silicon layer 210 to be amorphized and recrystallized, is formed on the stress layer 230. The first portion 210a of the silicon layer 210 is then amorphized through ion implantation 244 using the patterned photoresist layer 242 as a mask. The amorphizing ion may be selected from the group consisting of Si, Ge, Ar, C, O, N, H, He, Kr, Xe, P, B and As ions. It is noted that the compressive stress in the portion of the stress layer 230 over the first portion 210a of the silicon layer 210 is erased by the ion implantation 244.

Referring to FIGS. 2A & 2B, after the patterned photoresist layer 242 is removed, a trench 240 is formed between the amorphized first portion 210a and a second portion 210b of <110> orientation of the silicon layer 210 through the stress layer 230 and the pad oxide layer 220 and into the silicon substrate 200.

Referring to FIG. 2C, an SPE process is executed to recrystallize the amorphized first portion 210a of the silicon layer 210 to be a recrystallized layer 210c of <100> orientation, and an annealing process is performed at a temperature lower than 1200° C. to convert a surface layer of the second portion 210b of the silicon layer 210 of <110> orientation to a strained layer 215 of <110> orientation. Since the compressive stress in the stress layer 230 over the recrystallized layer 210c has been erased by the ion implantation 244 for amorphizing the first portion 210a of the silicon layer 210, no strained silicon is formed in the recrystallized layer 210c. The annealing process is preferably done at a temperature between 900° C. and 1150° C. for 10-240 minutes. Because the stress layer 230 is a compressive stress layer, the strained layer 215 is a compressive-strained silicon layer of <110> orientation that can much improve the speed of the PMOS transistor to be formed thereon.

Subsequent steps include filling the trench 240 with an insulating material and removing the stress layer 230 and the pad oxide layer 220 possibly through wet etching. The resulting structure is similar to that shown in FIG. 1F.

Fourth Embodiment

The process flow of fabricating a hybrid orientation substrate according to the fourth embodiment of the invention is also illustrated in FIGS. 2A-2C.

The fabricating process according to the fourth embodiment is similar to that according to the third one except the orientation of each silicon part in the structure in each of FIGS. 2A-2C. Specifically, the orientation of the silicon substrate 200 and the recrystallized layer 210c is <110>, and that of the silicon layer 210 the portion 210b of the silicon layer 210 and the strained layer 215 is <100>. The portion 210b of the silicon layer 210 and the strained layer 215 thereon is for forming a NMOS transistor. The recrystallized layer 210c is for forming a PMOS transistor. The stress layer 230 is a tensile stress layer to make the strained layer 215 a tensile-strained one capable of improving the speed of the NMOS transistor to be formed thereon.

FIG. 1F also shows a structure of a hybrid orientation substrate according to an embodiment of this invention. The structure includes a silicon substrate 100 with a first orientation having a trench 140 therein, a first silicon layer 110d as a recrystallized silicon layer with the first orientation directly on the substrate 100, a second silicon layer 110a with a second orientation directly on the substrate 100, a strained silicon layer 115 with the second orientation directly on the second silicon layer 110a, and an isolation structure 150 that separates the first and the second silicon layers 110d and 110a and fills the trench 140.

For the above structure, it is possible that the first orientation is <100> and the second orientation is <110>, or alternatively that the first orientation is <110> and the second orientation is <100>. The isolation structure 150 is usually a shallow trench isolation (STI) structure that may include silicon oxide. When the first orientation is <100> and the second one is <110>, the strained silicon layer 115 has <110> orientation and is a compressive-strained silicon layer on which a PMOS transistor is suitably formed for higher hole mobility. When the first orientation is <110> and the second one is <100>, the strained silicon layer 115 has <100> orientation and is a tensile-strained silicon layer on which a NMOS transistor is suitably formed for higher electron mobility.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of fabricating a hybrid orientation substrate, comprising:
providing a silicon substrate with a first orientation that has a silicon layer with a second orientation directly thereon;
forming a stress layer on the silicon layer;
forming a trench between a first portion and a second portion of the silicon layer through the stress layer and into the silicon substrate;
amorphizing the first portion of the silicon layer through the stress layer, wherein the stress layer is disposed on the first portion and the second portion of the silicon layer;
performing a solid-phase epitaxy (SPE) process to recrystallize the amorphized first portion of the silicon layer to be a recrystallized layer with the first orientation;
after performing the SPE process, performing an annealing process at a temperature lower than 1200° C. to convert a surface layer of the second portion of the silicon layer to a strained layer;
filling the trench with an insulating material after the SPE process or the annealing process; and
removing the stress layer.

2. The method of claim 1, wherein the step of forming the trench is before the step of amorphizing the first portion of the silicon layer.

3. The method of claim 2, wherein the first orientation is <100> and the second orientation is <110>.

4. The method of claim 3, wherein the stress layer is a compressive stress layer.

5. The method of claim 2, wherein the first orientation is <110> and the second orientation is <100>.

6. The method of claim 5, wherein the stress layer is a tensile stress layer.

7. The method of claim 1, wherein the step of amorphizing the first portion of the silicon layer is before the step of forming the trench.

8. The method of claim 7, wherein the first orientation is <100> and the second orientation is <110>.

9. The method of claim 8, wherein the stress layer is a compressive stress layer.

10. The method of claim 7, wherein the first orientation is <110> and the second orientation is <100>.

11. The method of claim 10, wherein the stress layer is a tensile stress layer.

12. The method of claim 1, wherein the step of amorphizing the first portion of the silicon layer comprises implanting an ion selected from the group consisting of Si, Ge, Ar, C, O, N, H, He, Kr, Xe, P, B and As ions.

13. The method of claim 1, wherein the SPE process is performed at a temperature between 500° C. and 700° C.

14. The method of claim 1, wherein the annealing process is performed at a temperature between 900° C. and 1150° C.

15. The method of claim 1, wherein the stress layer serves as a hard mask layer.

* * * * *